US010892596B2

(12) United States Patent
Enya et al.

(10) Patent No.: US 10,892,596 B2
(45) Date of Patent: Jan. 12, 2021

(54) OPTICAL MODULE (71) Applicant: Sumitomo Electric Industries, Ltd., Osaka (JP)

(72) Inventors: Yohei Enya, Itami (JP); Hiromi Nakanishi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/472,564

(22) PCT Filed: Oct. 27, 2017

(86) PCT No.: PCT/JP2017/038841
§ 371 (c)(1),
(2) Date: Jun. 21, 2019

(87) PCT Pub. No.: WO2018/116634
PCT Pub. Date: Jun. 28, 2018

(65) Prior Publication Data
US 2019/0326726 A1 Oct. 24, 2019

(30) Foreign Application Priority Data
Dec. 22, 2016 (JP) .................. 2016-248768

(51) Int. Cl.
*H01S 5/40* (2006.01)
*H01S 5/024* (2006.01)
*H01S 5/022* (2006.01)

(52) U.S. Cl.
CPC ...... *H01S 5/02415* (2013.01); *H01S 5/02248* (2013.01); *H01S 5/4012* (2013.01); *H01S 5/02216* (2013.01); *H01S 5/4093* (2013.01)

(58) Field of Classification Search
CPC ............. H01S 5/02216; H01S 5/02415; H01S 5/4012; H01S 5/4093; H01S 5/02212; H01S 5/02248
See application file for complete search history.

(56) References Cited

U.S. PATENT DOCUMENTS

| 2003/0081309 A1* | 5/2003 | Nishi | H01S 5/0687 359/337.2 |
| 2005/0008049 A1* | 1/2005 | Oomori | H01S 5/02212 372/36 |
| 2013/0070206 A1* | 3/2013 | Kazama | H01S 5/4012 353/31 |

(Continued)

FOREIGN PATENT DOCUMENTS

| JP | 2001-264670 A | 9/2001 |
| JP | 2002-280659 A | 9/2002 |

(Continued)

*Primary Examiner* — Michael Carter
(74) *Attorney, Agent, or Firm* — Baker Botts L.L.P.; Michael A. Sartori (57) ABSTRACT

An optical module includes a first base member, a second base member disposed spatially away from the first base member, a first laser disposed on the first base member and configured to emit red light, a second laser disposed on the second base member and configured to emit light with a color other than red, and a first electronic cooling module disposed in contact with the first base member and configured to adjust a temperature of the first laser.

6 Claims, 9 Drawing Sheets

(56) References Cited

U.S. PATENT DOCUMENTS

2014/0240952 A1* 8/2014 Nakanishi ............ H01S 5/4012
362/19
2014/0293239 A1* 10/2014 Shimizu ................ G03B 21/16
353/52

FOREIGN PATENT DOCUMENTS

| JP | 2007-17925 A | 1/2007 |
| JP | 2007-65600 A | 3/2007 |
| JP | 2007-328895 A | 12/2007 |
| JP | 2009-93101 A | 4/2009 |

* cited by examiner

OPTICAL MODULE

TECHNICAL FIELD

The present disclosure relates to an optical module. The present application claims the priority based on Japanese Patent Application No. 2016-248768 filed on Dec. 22, 2016, the entire contents of which are incorporated herein by reference.

BACKGROUND ART

Optical modules including semiconductor light-emitting devices disposed in a package have been known (e.g., refer to PTL 1 to PTL 4). Such an optical module is used as a light source for various apparatuses such as display apparatuses, optical pickup apparatuses, and optical communication apparatuses.

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

An optical module according to the present disclosure includes a first base member, a second base member disposed spatially away from the first base member, a first laser disposed on the first base member and configured to emit red light, a second laser disposed on the second base member and configured to emit light with a color other than red, and a first electronic cooling module disposed in contact with the first base member and configured to adjust a temperature of the first laser.

DESCRIPTION OF EMBODIMENTS

The above optical module may be used in a wide temperature range from low temperature to high temperature. To achieve an optical output with high precision even in a wide temperature range, the temperature of the optical module needs to be adjusted.

The power consumption during the operation of the optical module is desirably as small as possible. Furthermore, the downsizing of the entire system that adjusts the temperature of the optical module has been demanded.

It is an object to provide an optical module whose power consumption can be decreased while the system size is decreased.

[Description of Embodiments of Present Disclosure]

First, embodiments of the present disclosure will be listed and described. An optical module according to the present disclosure includes a first base member, a second base member disposed spatially away from the first base member, a first laser disposed on the first base member and configured to emit red light, a second laser disposed on the second base member and configured to emit light with a color other than red, and a first electronic cooling module disposed in contact with the first base member and configured to adjust a temperature of the first laser.

In this configuration, the temperature of the first laser that emits red light can be adjusted using the first electronic cooling module. The first laser that emits red light has a large temperature dependence of an optical output relative to an input power (emission efficiency). Only the first laser that emits red light and has a large temperature dependence can be efficiently cooled using the first electronic cooling module. Thus, the power consumption during the operation of the first electronic cooling module can be decreased. Furthermore, the amount of heat generated from the first electronic cooling module itself during its operation can be decreased. In this case, when a heat dissipation system including a heat sink and optionally a fan and a heat pipe to cool the first electronic cooling module is provided, the power consumption of the heat dissipation system can be decreased by, for example, shortening the operation time of the fan.

Since the amount of heat generated from the first electronic cooling module is decreased, the heat sink whose heat dissipation capacity is mainly dependent on its size can be downsized and furthermore the heat dissipation system including the heat sink can be downsized. As a result, the power consumption can be decreased while the system size is decreased. In addition, the second base member is disposed spatially away from the first base member and thus the thermal conduction between the first base member and the second base member can be suppressed.

In the above optical module, the second laser may be configured to emit green light or blue light. In this configuration, when red light from the first laser and green light or blue light from the second laser are multiplexed and emitted in the optical module, the power consumption can be decreased while the system size is decreased.

The above optical module may further include a second electronic cooling module disposed in contact with the second base member and configured to adjust a temperature of the second laser. Thus, the second laser can be cooled using the second electronic cooling module. Since the first base member and the second base member are thermally separated from each other (thermal conduction is suppressed), the temperature of the first laser that emits red light and the temperature of the second laser that emits light with a color other than red can be separately adjusted. Therefore, a large temperature change can be handled.

In the above optical module, optical axis heights of the first laser and the second laser from a reference surface may match each other. In this configuration, light from the first laser and light from the second laser can be appropriately multiplexed and emitted in the optical module.

The above optical module may further include a protective member that surrounds the first base member, the second base member, the first laser, the second laser, the first electronic cooling module, and the second electronic cooling module. In this configuration, for example, dry air present in a region surrounded by the protective member can be located between the first base member and the second base member, which further facilitates the thermal separation between the first base member and the second base member. That is, the thermal conduction between the first base member and the second base member can be suppressed.

[Details of Embodiments of Present Disclosure]

First Embodiment

Next, a first embodiment that is one embodiment of an optical module according to the present disclosure will be described with reference to FIG. 1 to FIG. 11. FIG. 2 is a diagram in a state in which a cap 40 in FIG. 1 has been dismounted. In the following drawings, the same or corresponding parts are designated by the same reference numerals, and the description thereof may be omitted.

Figure 1:
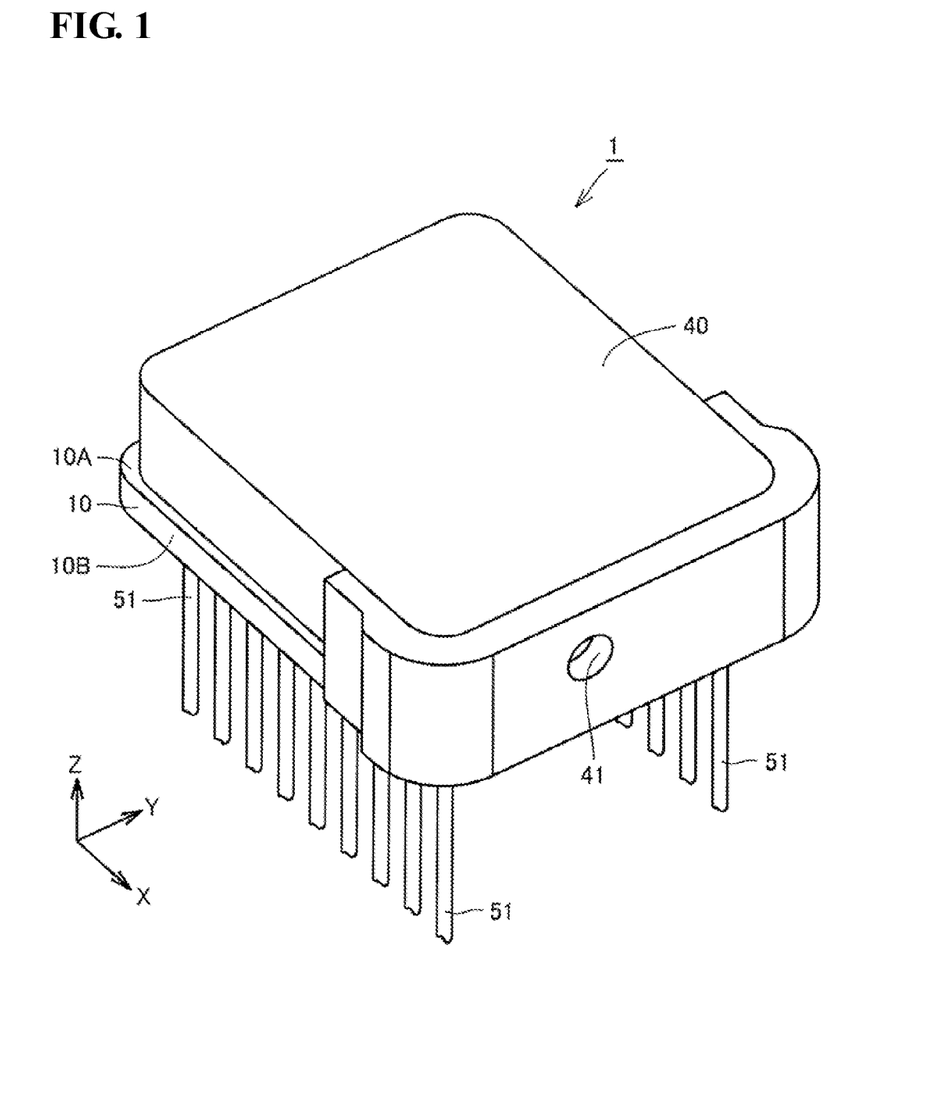
FIG. 1 is a schematic perspective view illustrating a structure of an optical module according to a first embodiment.
Figure 2:
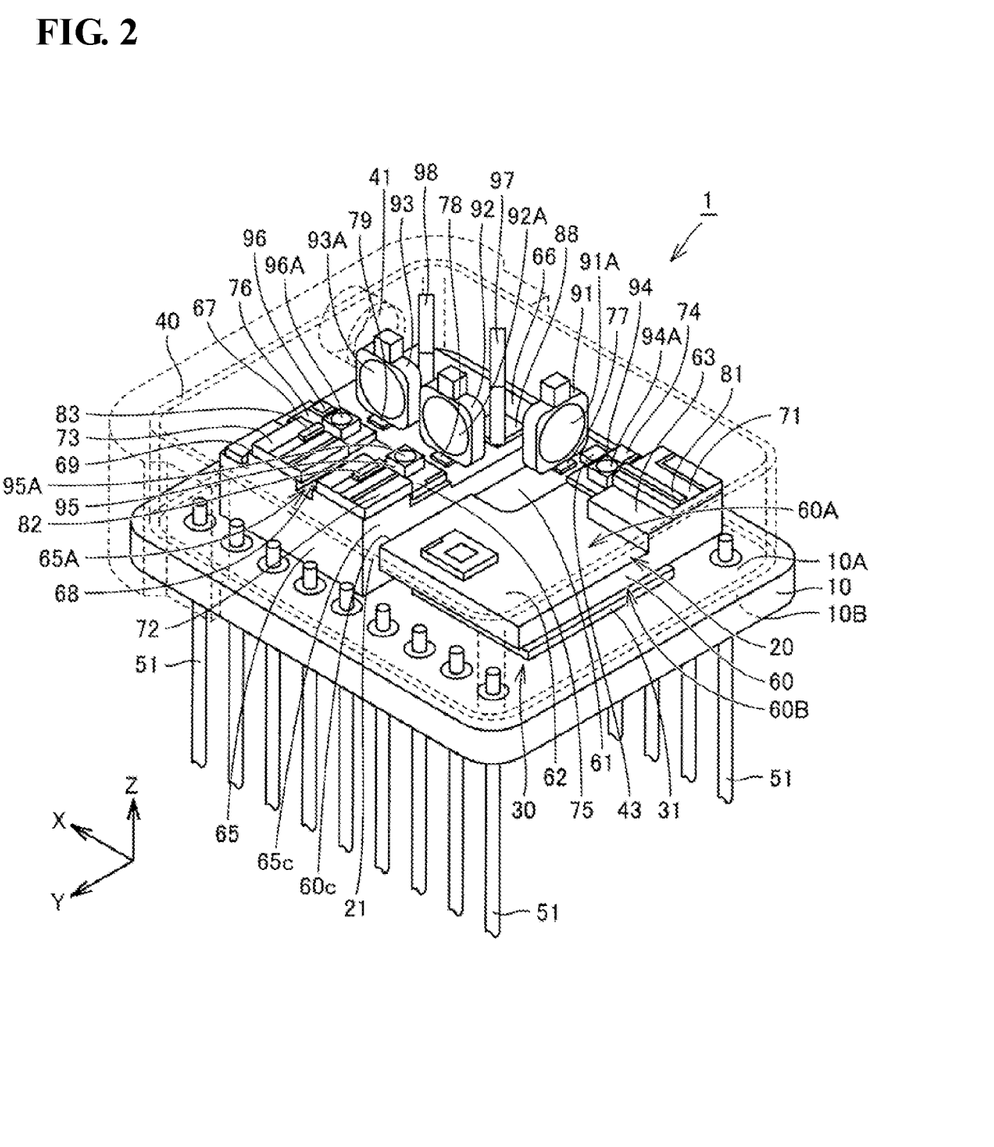
FIG. 2 is a schematic perspective view illustrating an internal structure of the optical module according to the first embodiment.

Referring to FIG. 1 and FIG. 2, an optical module 1 according to the first embodiment includes a base 10 having a flat-plate shape, a light-forming part 20 disposed on one main surface 10A of the base 10 and serving as a light-emitting unit for forming light, a cap 40 disposed in contact with the one main surface 10A of the base 10 so as to cover the light-forming part 20, and a plurality of lead pins 51 that penetrate from the other main surface 10B to the one main surface 10A of the base 10 and protrude from the one main surface 10A and the other main surface 10B. The base 10 and the cap 40 are disposed in an airtight state through, for example, welding. That is, the light-forming part 20 is hermetically sealed between the base 10 and the cap 40. A gas whose moisture content is reduced (whose moisture is removed), such as dry air, is enclosed in a space surrounded by the base 10 and the cap 40. An emission window 41 that transmits light from the light-forming part 20 is formed in the cap 40. The emission window 41 may have a flat-plate shape whose main surfaces are parallel to each other or may have a lens shape that condenses or diffuses light from the light-forming part 20. The base 10 and the cap 40 constitute a protective member. The base 10 has a rectangular shape whose four corners are rounded when viewed in plan (when viewed in a Z-axis direction). The cap 40 also has a rectangular shape whose four corners are rounded when viewed in plan. The base 10 has a larger area than the cap 40. When the cap 40 is disposed in contact with the base 10, the periphery of the base 10 protrudes from the periphery of the cap 40 in a flanged manner, except for the side on which the emission window 41 is disposed. The length of the short sides of the base 10 (the length in a Y-axis direction) is set to, for example, 10 mm (millimeters).

Figure 3:
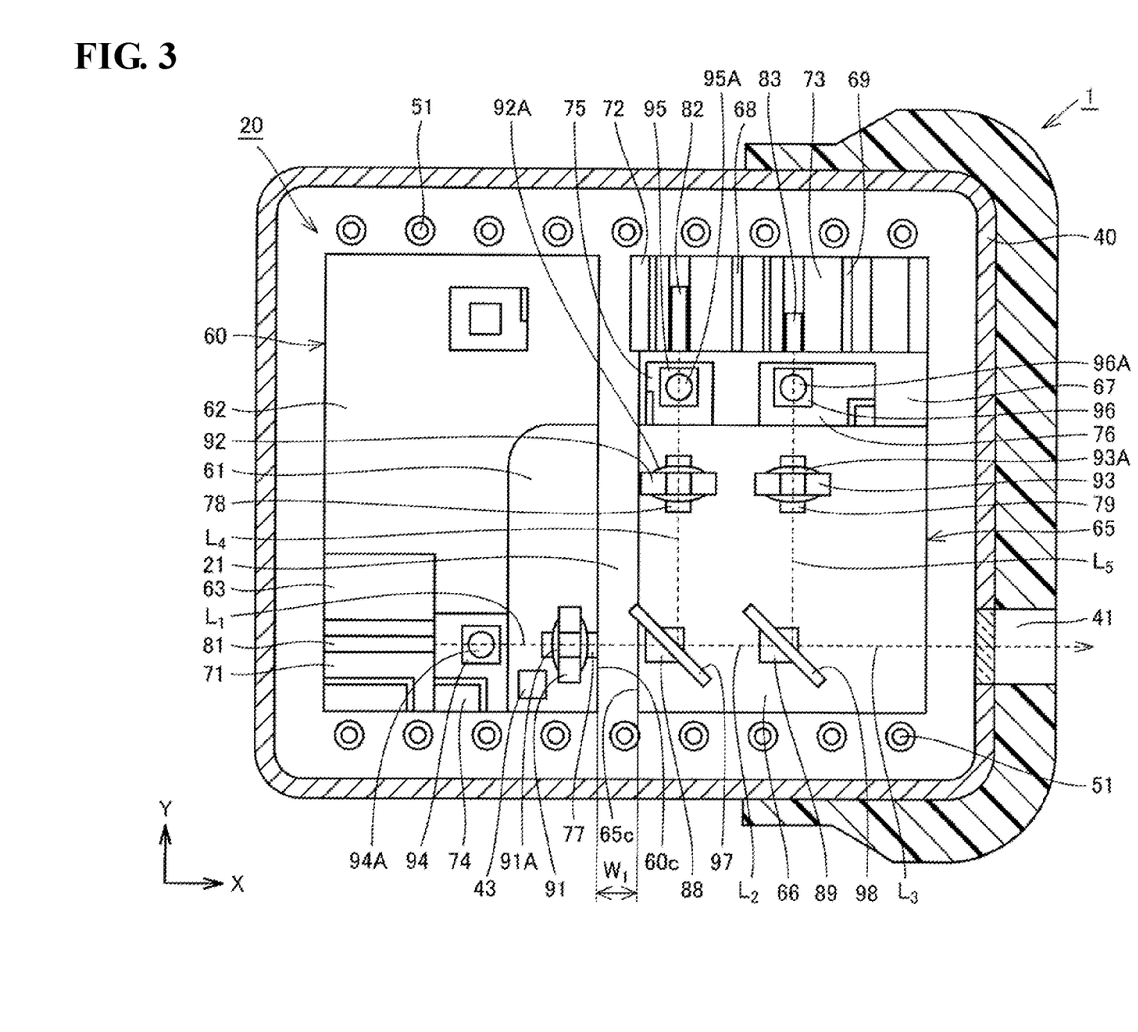
FIG. 3 is a schematic plan view illustrating a structure of the optical module according to the first embodiment.

Referring to FIG. 2 and FIG. 3, the light-forming part 20 includes a first base plate 60 serving as a first base member having a plate shape and a second base plate 65 serving as a second base member also having a plate shape. The first base plate 60 and the second base plate 65 each have a rectangular shape when viewed in plan (when viewed in a Z-axis direction). The first base plate 60 and the second base plate 65 are disposed spatially away from each other. The width of a gap 21 located between the first base plate 60 and the second base plate 65, that is, the distance $W_1$ between a side surface 60C of the first base plate 60 that faces the second base plate 65 and a side surface 65C of the second base plate 65 that faces the first base plate 60 in FIG. 3 is specifically set to, for example, 0.5 mm. The gas whose moisture content is reduced (whose moisture is removed), such as dry air, is present between the first base plate 60 and the second base plate 65. The first base plate 60 and the second base plate 65 are disposed in a thermally separated manner (with reduced thermal conduction).

Subsequently, the configuration of the first base plate 60 will be described. The first base plate 60 has one main surface 60A having a rectangular shape with long sides in the Y-axis direction when viewed in plan. The first base plate 60 has a first base region 61 and a first chip mounted region 62. The first chip mounted region 62 is formed in a region including one short side of the one main surface 60A and one long side connected to the short side. The first chip mounted region 62 has a larger thickness than the first base region 61. Consequently, the first chip mounted region 62 is taller than the first base region 61. The first chip mounted region 62 includes a first laser mounted region 63 on a side opposite to the side at which the one short side is connected to the one long side. The first laser mounted region 63 is a region having a larger thickness (taller) than the adjacent region. A first submount 71 having a flat-plate shape is disposed on the first laser mounted region 63. A red laser diode 81 that emits red light and serves as a first laser is disposed on the first submount 71.

A fourth submount 74 is disposed on the first chip mounted region 62 of the first base plate 60. A first photodiode 94 serving as a first light-receiving device is disposed on the fourth submount 74. The height of the first photodiode 94 (the distance to an optical axis of the red laser diode 81, that is, the distance in the Z-axis direction) is adjusted by the fourth submount 74. The first photodiode 94 is disposed at a position at which the first photodiode 94 directly receives light emitted from the red laser diode 81. The first photodiode 94 is a photodiode capable of receiving red light. The first photodiode 94 is disposed between the red laser diode 81 and a first lens 91 in an emission direction of light from the red laser diode 81.

A first lens support member 77 that protrudes upward is formed on the first base region 61 of the first base plate 60. A first lens 91 is disposed on the first lens support member 77. The first lens 91 includes a lens unit 91A having a lens surface. In the first lens 91, the lens unit 91A and a region other than the lens unit 91A are formed in one piece. The central axis of the lens unit 91A of the first lens 91, that is, the optical axis of the lens unit 91A is adjusted by the first lens support member 77 so as to coincide with the optical axis of the red laser diode 81. The first lens 91 is configured to convert the spot size of light emitted from the red laser diode 81. The spot size of light emitted from the red laser diode 81 is converted by the first lens 91 so as to match the spot sizes of light emitted from a green laser diode 82 described later and light emitted from a blue laser diode 83 described later. The optical module 1 includes a thermistor 43. The thermistor 43 is disposed at a position away from the first lens support member 77 on the first base region 61 of the first base plate 60.

Subsequently, the configuration of the second base plate 65 will be described. The second base plate 65 also has one main surface 65A having a rectangular shape with long sides in the Y-axis direction when viewed in plan. The one main surface 65A of the second base plate 65 (the distance from the one main surface 10A of the base 10 in the Z-axis direction) has the same height as the one main surface 60A of the first base plate 60. The second base plate 65 has a second base region 66 and a second chip mounted region 67. The second chip mounted region 67 is formed in a region that includes the entire one short side of the one main surface 65A. The second chip mounted region 67 has a larger thickness than the second base region 66. Consequently, the second chip mounted region 67 is taller than the second base region 66. The second chip mounted region 67 partly includes a second laser mounted region 68 and a third laser mounted region 69 that are regions having a larger thickness (taller) than the adjacent region. The second laser mounted region 68 and the third laser mounted region 69 are disposed away from each other in an X-axis direction.

A second submount 72 having a flat-plate shape is disposed on the second laser mounted region 68. A green laser diode 82 that emits green light and serves as a second laser is disposed on the second submount 72. A third submount 73 having a flat-plate shape is disposed on the third laser mounted region 69. A blue laser diode 83 that emits blue light and serves as a third laser is disposed on the third submount 73. The optical axis heights of the red laser diode 81, the green laser diode 82, and the blue laser diode 83 (the distances between the optical axes and the reference surfaces that are the one main surface 60A of the first base plate 60 and the one main surface 65A of the second base plate 65 which have the same height, that is, the distances from the reference surfaces in the Z-axis direction) are adjusted by the first submount 71, the second submount 72, and the third submount 73. The red light is light having a wavelength of about 620 nm (nanometers) to 750 nm, the green light is light having a wavelength of about 495 nm to 570 nm, and the blue light is light having a wavelength of about 420 nm to 495 nm.

A fifth submount 75 and a sixth submount 76 are disposed on the second chip mounted region 67 of the second base plate 65. A second photodiode 95 serving as a second light-receiving device and a third photodiode 96 serving as a third light-receiving device are disposed on the fifth submount 75 and the sixth submount 76, respectively. The heights of the second photodiode 95 and the third photodiode 96 (the distances to the optical axes of the green laser diode 82 and the blue laser diode 83, that is, the distances in the Z-axis direction) are adjusted by the fifth submount 75 and the sixth submount 76, respectively. The second photodiode 95 and the third photodiode 96 are disposed at positions at which they directly receive light from the green laser diode 82 and light from the blue laser diode 83, respectively. In this configuration, the light intensity is grasped with high precision, and the light intensity can be controlled with high precision. In this embodiment, light-receiving devices for the corresponding lasers are disposed. The second photodiode 95 and the third photodiode 96 are photodiodes capable of respectively receiving green light and blue light. The second photodiode 95 is disposed between the green laser diode 82 and a second lens 92 in an emission direction of light from the green laser diode 82. The third photodiode 96 is disposed between the blue laser diode 83 and a third lens 93 in an emission direction of light from the blue laser diode 83.

A second lens support member 78 and a third lens support member 79 that each protrude upward are formed on the second base region 66 of the second base plate 65. A second lens 92 and a third lens 93 are disposed on the second lens support member 78 and the third lens support member 79, respectively. The second lens 92 and the third lens 93 respectively include lens units 92A and 93A each having a lens surface. In the second lens 92, the lens unit 92A and a region other than the lens unit 92A are formed in one piece. In the third lens 93, the lens unit 93A and a region other than the lens unit 93A are formed in one piece. The central axes of the lens units 92A and 93A of the second lens 92 and the third lens 93, that is, the optical axes of the lens units 92A and 93A are respectively adjusted by the second lens support member 78 and the third lens support member 79 so as to coincide with the optical axes of the green laser diode 82 and the blue laser diode 83. The second lens 92 and the third lens 93 are configured to convert the spot sizes of light emitted from the green laser diode 82 and light emitted from the blue laser diode 83, respectively. The spot sizes of light emitted from the red laser diode 81, light emitted from the green laser diode 82, and light emitted from the blue laser diode 83 are respectively converted by the first lens 91, the second lens 92, and the third lens 93 so as to match each other.

A first filter 97 and a second filter 98 are disposed on the second base region 66 of the second base plate 65. The first filter 97 and the second filter 98 each have a flat-plate shape having main surfaces parallel to each other. The first filter 97 and the second filter 98 are, for example, wavelength selective filters. The first filter 97 and the second filter 98 are dielectric multilayer film filters. More specifically, the first filter 97 transmits red light and reflects green light. The second filter 98 transmits red light and green light and reflects blue light. The first filter 97 and the second filter 98 selectively transmit or reflect light with a particular wavelength. As a result, the first filter 97 and the second filter 98 multiplex light emitted from the red laser diode 81, light emitted from the green laser diode 82, and light emitted from the blue laser diode 83. The first filter 97 and the second filter 98 are respectively disposed on a first protruding region 88 and a second protruding region 89 that are formed on the second base region 66 so as to protrude upward.

Referring to FIG. 3, the red laser diode 81, a light-receiving unit 94A of the first photodiode 94, the lens unit 91A of the first lens 91, the first filter 97, and the second filter 98 are arranged in a straight line in the emission direction of light from the red laser diode 81 (in the X-axis direction). The green laser diode 82, a light-receiving unit 95A of the second photodiode 95, the lens unit 92A of the second lens 92, and the first filter 97 are arranged in a straight line in the emission direction of light from the green laser diode 82 (in the Y-axis direction). The blue laser diode 83, a light-receiving unit 96A of the third photodiode 96, the lens unit 93A of the third lens 93, and the second filter 98 are arranged in a straight line in the emission direction of light from the blue laser diode 83 (in the Y-axis direction). That is, the emission direction of light from the red laser diode 81 intersects the emission direction of light from the green laser diode 82 and light from the blue laser diode 83. More specifically, the emission direction of light from the red laser diode 81 is orthogonal to the emission direction of light from the green laser diode 82 and light from the blue laser diode 83. The emission direction of light from the green laser diode 82 is the same as the emission direction of light from the blue laser diode 83. More specifically, the emission direction of light from the green laser diode 82 is parallel to the emission direction of light from the blue laser diode 83. The main surfaces of the first filter 97 and the second filter 98 incline with respect to the emission direction of light from the red laser diode 81. More specifically, the main surfaces of the first filter 97 and the second filter 98 incline at 45° with respect to the emission direction of light from the red laser diode 81 (X-axis direction).

Subsequently, the operation of the optical module 1 according to this embodiment will be described. Referring to FIG. 3, red light emitted from the red laser diode 81 travels along an optical path $L_1$. Herein, part of the red light directly enters the light-receiving unit 94A of the first photodiode 94. Thus, the intensity of the red light emitted from the red laser diode 81 is grasped, and the intensity of the red light is adjusted based on the difference between the grasped intensity of light and the target intensity of light to be emitted. The red light that has traveled over the first photodiode 94 enters the lens unit 91A of the first lens 91, and the spot size of the light is converted. Specifically, for example, the red light emitted from the red laser diode 81 is converted into collimated light. The red light whose spot size has been converted at the first lens 91 travels along the optical path $L_1$ and enters the first filter 97. Since the first filter 97 transmits red light, the light emitted from the red laser diode 81 further travels along an optical path $L_2$ and enters the second filter 98. Since the second filter 98 transmits red light, the light emitted from the red laser diode 81 further travels along an optical path $L_3$ and is emitted to the outside of the optical module 1 through the emission window 41 of the cap 40.

Green light emitted from the green laser diode 82 travels along an optical path $L_4$. Herein, part of the green light directly enters the light-receiving unit 95A of the second photodiode 95. Thus, the intensity of the green light emitted from the green laser diode 82 is grasped, and the intensity of the green light is adjusted based on the difference between the grasped intensity of light and the target intensity of light to be emitted. The green light that has traveled over the second photodiode 95 enters the lens unit 92A of the second lens 92, and the spot size of the light is converted. Specifically, for example, the green light emitted from the green laser diode 82 is converted into collimated light. The green light whose spot size has been converted at the second lens 92 travels along the optical path $L_4$ and enters the first filter 97. Since the first filter 97 reflects green light, the light emitted from the green laser diode 82 joins the optical path $L_2$. As a result, the green light is multiplexed with the red light, and travels along the optical path $L_2$ and enters the second filter 98. Since the second filter 98 transmits green light, the light emitted from the green laser diode 82 further travels along the optical path $L_3$ and is emitted to the outside of the optical module 1 through the emission window 41 of the cap 40.

Blue light emitted from the blue laser diode 83 travels along an optical path $L_5$. Herein, part of the blue light directly enters the light-receiving unit 96A of the third photodiode 96. Thus, the intensity of the blue light emitted from the blue laser diode 83 is grasped, and the intensity of the blue light is adjusted based on the difference between the grasped intensity of light and the target intensity of light to be emitted. The blue light that has traveled over the third photodiode 96 enters the lens unit 93A of the third lens 93, and the spot size of the light is converted. Specifically, for example, the blue light emitted from the blue laser diode 83 is converted into collimated light. The blue light whose spot size has been converted at the third lens 93 travels along the optical path $L_5$ and enters the second filter 98. Since the second filter 98 reflects blue light, the light emitted from the blue laser diode 83 joins the optical path $L_3$. As a result, the blue light is multiplexed with the red light and the green light, and travels along the optical path $L_3$ and is emitted to the outside of the optical module 1 through the emission window 41 of the cap 40.

The optical module 1 includes a first electronic cooling module (hereafter may also be referred to as a first TEC (thermo-electric cooler)) 30. Specifically, the optical module 1 includes a first TEC disposed between the first base plate 60 included in the light-forming part 20 and the base 10. The first TEC is a so-called thermo-electric cooler and includes a heat-absorbing plate (not illustrated), a heat-dissipating plate 31, and a plurality of semiconductor pillars (not illustrated) arranged away from each other between the heat-absorbing plate and the heat-dissipating plate 31, with electrodes disposed therebetween. The heat-absorbing plate and the heat-dissipating plate 31 are formed of, for example, alumina. The heat-absorbing plate is disposed in contact with the other main surface 60B of the first base plate 60. The heat-dissipating plate 31 is disposed in contact with the one main surface 10A of the base 10.

The first TEC 30 is a Peltier module (Peltier device). By supplying an electric current to the first TEC 30, heat of the first base plate 60 in contact with the heat-absorbing plate moves to the base 10, which cools the first base plate 60. As a result, an increase in the temperature of the red laser diode 81 can be suppressed. For the first TEC 30, for example, in the case where the optical module 1 is placed in an environment at an extremely low temperature of −(minus)40° C. (Celsius), if heating of the optical module 1 is desired from the viewpoint of the output efficiency of the red laser diode 81, a reverse current can be caused to flow through the first TEC 30 to reverse the movement of heat, thereby heating the first base plate 60. The first TEC 30 itself generates heat during the operation of the first TEC 30. To ensure the stable operation of the first TEC 30, heat generated from the first TEC 30 during the operation of the first TEC 30 needs to be removed.

Figure 4:
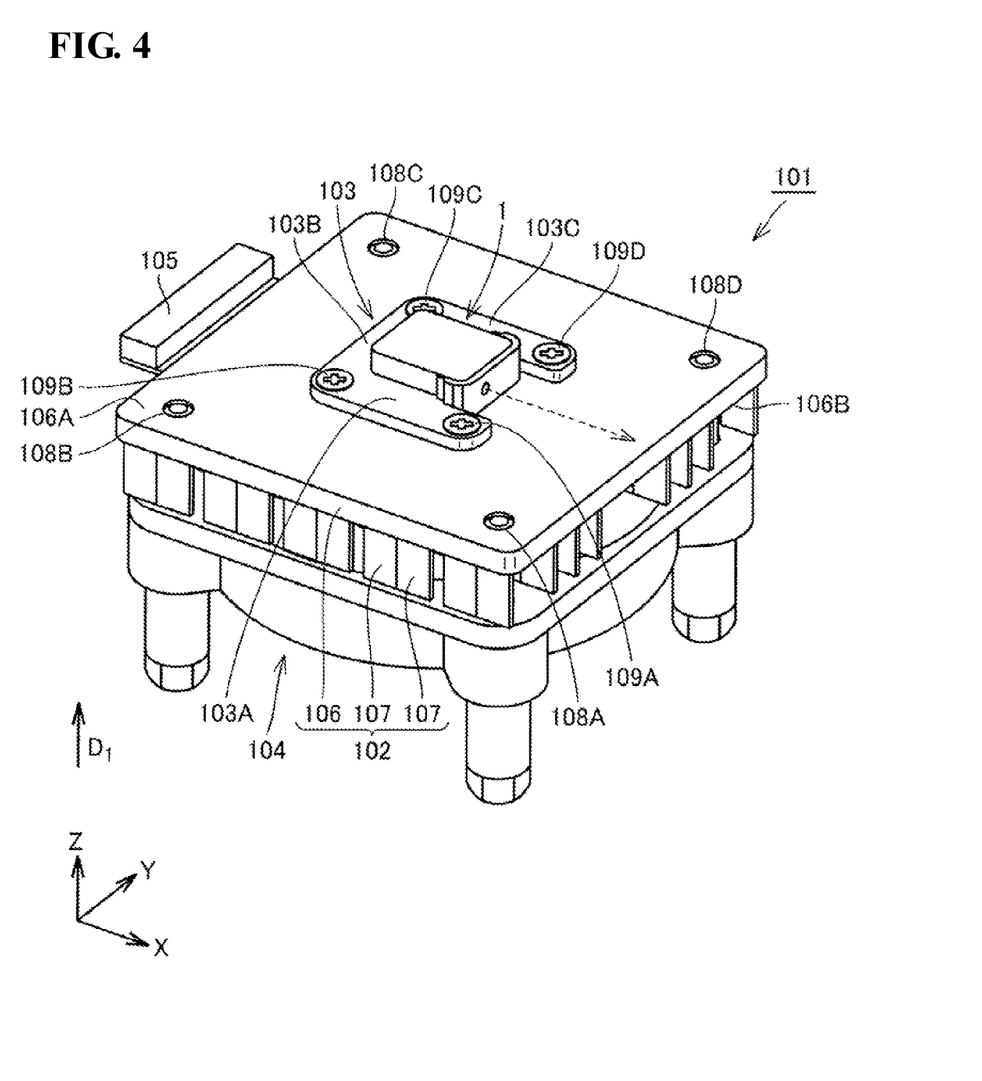
FIG. 4 is a schematic perspective view illustrating a structure of a heat dissipation system to which the optical module is attached.

Subsequently, a heat dissipation system 101 to which the optical module 1 is attached will be described.

Referring to FIG. 4, the heat dissipation system 101 is provided to remove heat of the first TEC 30 generated during the operation of the first TEC through heat dissipation. The heat dissipation system 101 includes a heat sink 102, a presser plate 103, a fan 104, and a connector 105. The heat sink 102 is formed of a metal material having good heat transfer properties, such as aluminum, iron, or copper. In FIG. 4, the direction in which light is emitted from the optical module 1 is indicated by an arrow with a broken line.

The heat sink 102 is constituted by a base member 106 and a plurality of fins 107. The base member 106 is a plate-shaped member having a rectangular shape when viewed in a plate-thickness direction (Z-axis direction). More specifically, the base member 106 has a square shape when viewed in plan. In this embodiment, the length of the sides of the base member 106 is about 50 mm.

The optical module 1 is disposed on one main surface 106A of the base member 106. In a central region of the base member 106, through-holes (not illustrated) that extend through the base member 106 in the plate-thickness direction are formed at positions corresponding to the plurality of lead pins 51 when the optical module 1 is disposed on the one main surface 106A of the base member 106. The number of the through-holes is the same as that of the plurality of lead pins 51. Therefore, when the optical module 1 is disposed on the one main surface 106A of the base member 106, the plurality of lead pins 51 are inserted into the plurality of through-holes. The size of openings of the through-holes is set so that the lead pins 51 inserted into the through-holes do not come into contact with the base member 106. In the central region of the one main surface 106A of the base member 106, four tapped holes (not illustrated) used for attaching the presser plate 103 are formed in an outer region of the plurality of through-holes into which the lead pins 51 are inserted. In four corner regions of the base member 106, four tapped holes 108A, 108B, 108C, and 108D for attaching the fan 104 are formed so as to extend in the plate-thickness direction.

A plurality of fins 107 are disposed on the other main surface 106B of the base member 106. The fins 107 each have a thin plate shape and are disposed on the other main surface 106B of the base member 106 so as to be spaced from each other. Each of the fins 107 is disposed so as to extend from the other main surface 106B of the base member 106 downward in the Z-axis direction, that is, in a direction opposite to the direction indicated by an arrow $D_1$. The fins 107 have the same height, that is, the same length from the other main surface 106B of the base member 106 in the Z-axis direction. The thickness of the heat sink 102 including the base member 106 and the plurality of fins 107 is about 10 mm. By disposing the plurality of fins 107, the surface area of the entire heat sink 102 is increased and thus the heat dissipation performance of the heat sink 102 is increased. The first TEC 30 is constituted by a Peltier device and has a mechanism in which the first base plate 60 is cooled by passing an electric current. On the other hand, the heat dissipation system 101 has a mechanism in which heat generated from the first TEC 30 in contact with the heat sink 102 formed of a material having good heat transfer properties is transferred to the heat sink 102 and then dissipated. Therefore, the first TEC 30 and the heat dissipation system 101 are different from each other in terms of the system that removes heat. For the heat dissipation system 101, the heat dissipation efficiency increases as the surface area of the base member 106 and the plurality of fins 107 of the heat sink 102 increases.

The optical module 1 is attached to the base member 106 so as to be located in the central region of the one main surface 106A of the base member 106 included in the heat sink 102. When the optical module 1 is disposed on the base member 106, the above-described plurality of through-holes are formed at positions of the base member 106 that correspond to the plurality of lead pins 51 protruding toward the one main surface 106A. The optical module 1 is attached to the base member 106 so that the plurality of lead pins 51 do not come into contact with the base member 106.

The optical module 1 is attached to the base member 106 by a presser plate 103. The presser plate 103 will be described. The presser plate 103 includes a first guide portion 103A, a second guide portion 103B, and a third guide portion 103C. The first guide portion 103A, the second guide portion 103B, and the third guide portion 103C each have an elongated thin plate shape. In the presser plate 103, end portions of the first guide portion 103A and the second guide portion 103B that extend in orthogonal directions are joined together, and end portions of the second guide portion 103B and the third guide portion 103C that extend in orthogonal directions are joined together. Four through-holes (not illustrated) that extend through the presser plate 103 in a plate-thickness direction are formed at positions corresponding to the end portions of the first guide portion 103A, the second guide portion 103B, and the third guide portion 103C. The presser plate 103 is attached to the heat sink 102 by inserting four screws 109A, 109B, 109C, and 109D in total into the through-holes and putting the screws into the four tapped holes formed at the one main surface 106A of the base member 106.

The optical module 1 is attached to the heat sink 102 so that a region of the base 10 that protrudes in a flanged manner is sandwiched between the presser plate 103 and the base member 106.

The first guide portion 103A is disposed on one side surface of the cap 40 in a direction orthogonal to the direction in which light is emitted (on one side surface in the Y-axis direction). The second guide portion 103B is disposed on a side surface of the cap 40 on a side opposite to the side at which the emission window 41 is located.

The third guide portion 103C is disposed on the other side surface of the cap 40 in a direction orthogonal to the direction in which light is emitted (on the other side surface in the Y-axis direction). That is, the position of the optical module 1 is determined by the presser plate 103 on the one main surface 106A of the base member 106. Since the thickness of the optical module 1 in the plate-thickness direction is larger than that of the presser plate 103 in the plate-thickness direction, the optical module 1 protrudes from the presser plate 103 in the Z-axis direction. The optical module 1 is attached by applying a thermal grease (not illustrated) between the other main surface 10B of the base 10 and the one main surface 106A of the base member 106. This provides a good contact state between the other main surface 10B of the base 10 and the one main surface 106A of the base member 106, and thus heat generated from the first TEC 30 can be efficiently transferred to the heat sink 102.

The fan 104 is disposed on the other main surface 106B side of the base member 106. More specifically, the fan 104 is attached on the side of end portions of the plurality of fins 107 opposite to the end portions of the fins 107 closer to the other main surface 106B of the base member 106. By rotating the fan 104 through supply of an electric current to the fan 104, wind can be sent toward the fins 107, specifically, upward in the Z-axis direction indicated by an arrow $D_1$. By operating the fan 104, wind can be sent toward the heat sink 102 to cool the heat sink 102. The supply of an electric current to the fan 104 is controlled. Obviously, electric power is also consumed during the operation of the fan 104.

The heat sink 102 includes a connector 105 for ensuring electrical connection to the outside of the optical module 1. The connector 105 is disposed in a region of the heat sink 102 in a direction opposite to the direction in which light is emitted from the optical module 1. Although not illustrated, the connector 105 and the plurality of lead pins 51 disposed on the optical module 1 are electrically connected to each other. The electrical connection between the optical module 1 and the outside is ensured by using the connector 105, and thus an electric current can be supplied to the optical module 1 from the outside and, for example, the detected temperature information of the light-forming part 20 can be obtained.

Figure 5:
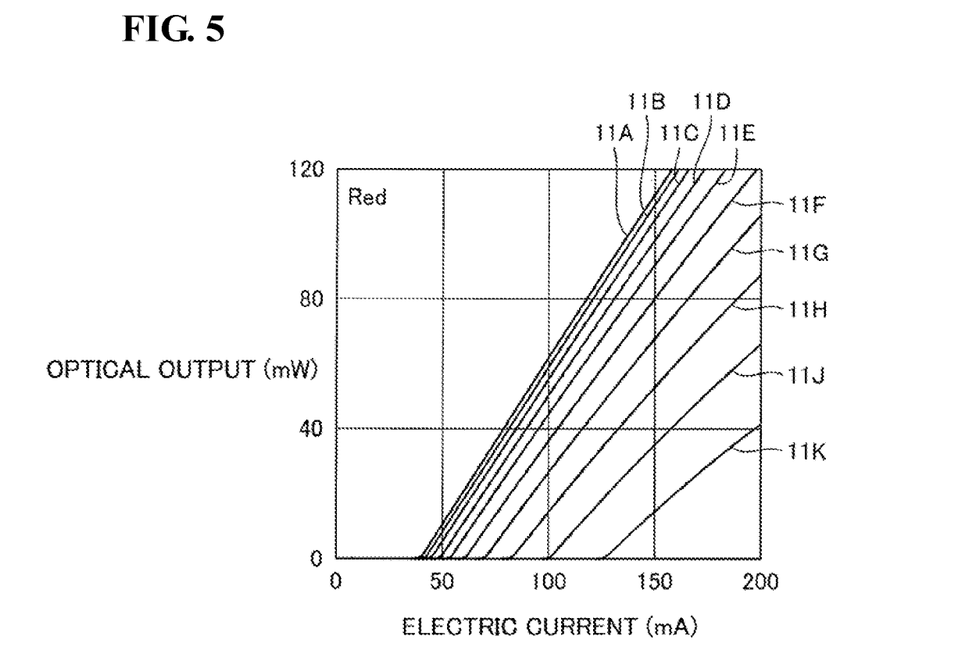
FIG. 5 is a graph illustrating the relationship between the electric current supplied to a red laser diode and the optical output of the red laser diode in terms of different temperatures.

Subsequently, the relationship between the electric current supplied to the red laser diode 81, the green laser diode 82, and the blue laser diode 83 serving as semiconductor light-emitting devices and the corresponding optical output will be described. FIG. 5 is a graph illustrating the relationship between the electric current supplied to the red laser diode 81 and the optical output of the red laser diode 81 in terms of different temperatures of an atmosphere in which the red laser diode 81 is disposed. In FIG. 5, the vertical axis shows an optical output (mW (milliwatt)) of the red laser diode 81 and the horizontal axis shows an electric current (mA (milliampere)) supplied to the red laser diode 81. In FIG. 5, a line 11A indicates the case at an atmosphere temperature of −40° C., a line 11B indicates the case at an atmosphere temperature of −20° C., a line 11C indicates the case at an atmosphere temperature of 0° C., a line 11D indicates the case at an atmosphere temperature of 10° C., a line 11E indicates the case at an atmosphere temperature of 20° C., a line 11F indicates the case at an atmosphere temperature of 30° C., a line 11G indicates the case at an atmosphere temperature of 40° C., a line 11H indicates the case at an atmosphere temperature of 50° C., a line 11J indicates the case at an atmosphere temperature of 60° C., and a line 11K indicates the case at an atmosphere temperature of 70° C.

Figure 6:
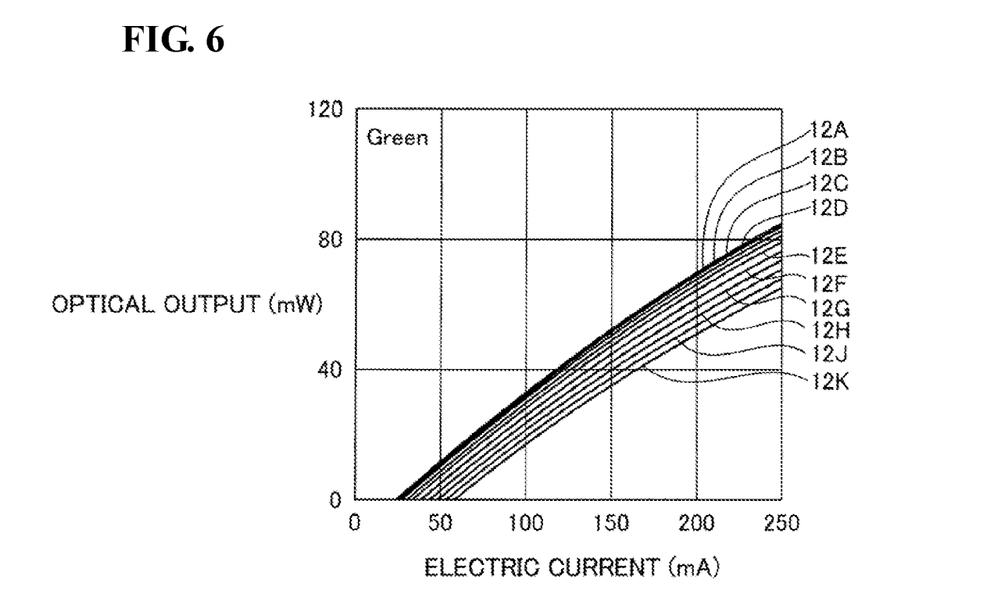
FIG. 6 is a graph illustrating the relationship between the electric current supplied to a green laser diode and the optical output of the green laser diode in terms of different temperatures.

FIG. 6 is a graph illustrating the relationship between the electric current supplied to the green laser diode 82 and the optical output of the green laser diode 82 in terms of different temperatures of an atmosphere in which the green laser diode 82 is disposed. In FIG. 6, the vertical axis shows an optical output (mW) of the green laser diode 82 and the horizontal axis shows an electric current (mA) supplied to the green laser diode 82. In FIG. 6, a line 12A indicates the case at an atmosphere temperature of −40° C., a line 12B indicates the case at an atmosphere temperature of −20° C., a line 12C indicates the case at an atmosphere temperature of 0° C., a line 12D indicates the case at an atmosphere temperature of 10° C., a line 12E indicates the case at an atmosphere temperature of 20° C., a line 12F indicates the case at an atmosphere temperature of 30° C., a line 12G indicates the case at an atmosphere temperature of 40° C., a line 12H indicates the case at an atmosphere temperature of 50° C., a line 12J indicates the case at an atmosphere temperature of 60° C., and a line 12K indicates the case at an atmosphere temperature of 70° C.

Figure 7:
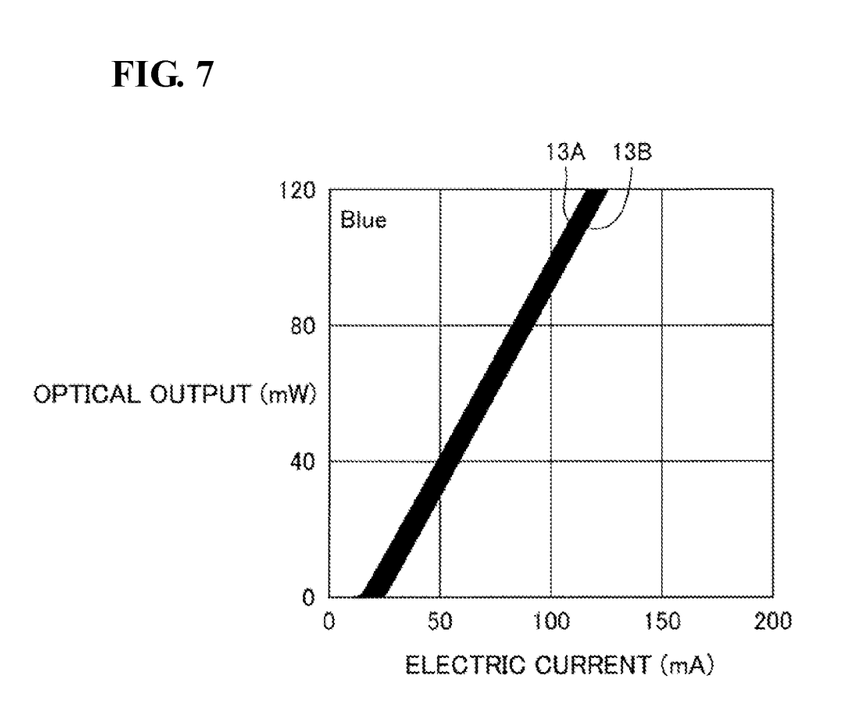
FIG. 7 is a graph illustrating the relationship between the electric current supplied to a blue laser diode and the optical output of the blue laser diode in terms of different temperatures.

FIG. 7 is a graph illustrating the relationship between the electric current supplied to the blue laser diode 83 and the optical output of the blue laser diode 83 in terms of different temperatures of an atmosphere in which the blue laser diode 83 is disposed. In FIG. 7, the vertical axis shows an optical output (mW) of the blue laser diode 83 and the horizontal axis shows an electric current (mA) supplied to the blue laser diode 83. In FIG. 7, a line 13A indicates the case at an atmosphere temperature of −40° C. and a line 13B indicates the case at an atmosphere temperature of 70° C.

In the graph in FIG. 7, the case at an atmosphere temperature of −20° C., the case at an atmosphere temperature of 0° C., the case at an atmosphere temperature of 10° C., the case at an atmosphere temperature of 20° C., the case at an atmosphere temperature of 30° C., the case at an atmosphere temperature of 40° C., the case at an atmosphere temperature of 50° C., and the case at an atmosphere temperature of 60° C. are also indicated by lines as in the cases of FIG. 5 and FIG. 6. However, the lines overlap each other and thus the symbols for the lines are omitted to facilitate the understanding. For the overlapped lines, the case at a temperature of −20° C. is closest to the line 13A, and the remaining lines come close to the line 13B in the order of the case at a temperature of 0° C., the case at a temperature of 10° C., the case at a temperature of 20° C., the case at a temperature of 30° C., the case at a temperature of 40° C., the case at a temperature of 50° C., and the case at a temperature of 60° C.

Referring to FIG. 5 to FIG. 7, the electric current required to obtain the same optical output tends to increase as the temperature increases regardless of the colors. In the case of the blue laser diode 83, the influence is small. That is, even if the atmosphere temperature is changed, the electric current supplied to obtain the same optical output is substantially the same. In the case of the green laser diode 82, the influence of the temperature is observed compared with the case of the blue laser diode 83, but the influence is not so large. In contrast, a large influence is observed in the case of the red laser diode 81. In other words, when the atmosphere temperature increases, the electric current supplied needs to be increased to obtain the same optical output. In FIG. 5, for example, when an optical output of 90 mW is desirably obtained, the electric current supplied is 140 mA in the case at an atmosphere temperature of 10° C. whereas the electric current supplied is 180 mA in the case at an atmosphere temperature of 40° C. Consequently, the amount of heat generated from the red laser diode 81 also increases as the temperature increases. For example, when the above-described optical module 1 is mounted on automobiles, stable color reproducibility needs to be achieved with high precision in a wide operating temperature range of about −40° C. to 105° C. Therefore, in particular, the temperature of the red laser diode 81 needs to be controlled by the above-described first TEC 30.

Figure 8:
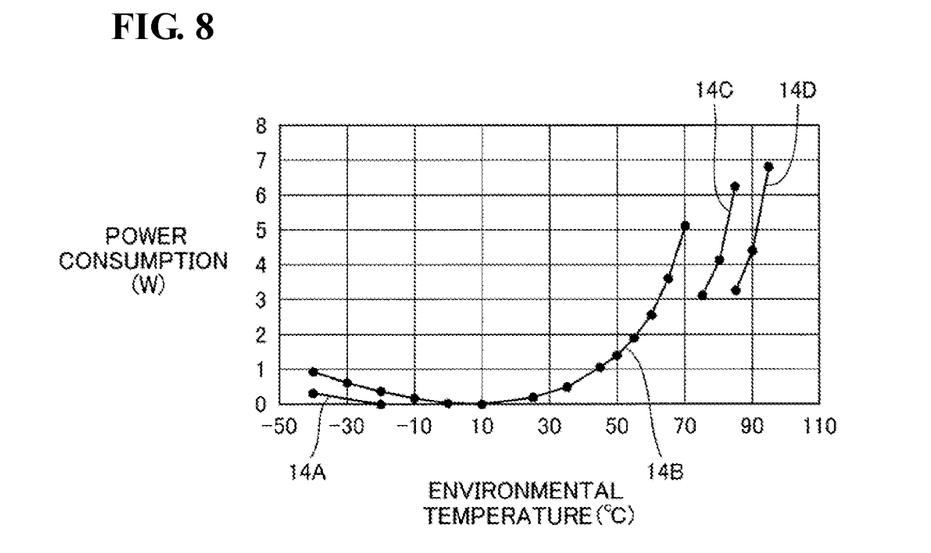
FIG. 8 is a graph illustrating the relationship between the environmental temperature and the power consumption of an electronic cooling module in terms of different temperatures of a light-forming part.

Subsequently, the relationship between the environmental temperature that is a temperature in an environment in which the light-forming part is disposed and the power consumption of a TEC will be described. FIG. 8 is a graph illustrating the relationship between the environmental temperature and the power consumption of a TEC in terms of different temperatures of a light-forming part. Herein, the optical module in FIG. 8 is different from the optical module 1 in FIG. 1 to FIG. 3 in that the first base plate 60 and the second base plate 65 are not disposed. Instead, a base plate serving as a single base member is used, and the TEC is disposed between the single base plate and a stem. In this case, the TEC is disposed in the substantially entire region of the single base plate, and the temperature of the light-forming part is adjusted by cooling all of the red laser diode, the green laser diode, and the blue laser diode. The driving conditions of the optical module from which the data of the graph in FIG. 8 is obtained are as follows. A CW (continuous wave) current is supplied. The optical output of the red laser diode is set to 90 mW, the optical output of the green laser diode is set to 60 mW, and the optical output of the blue laser diode is set to 50 mW.

The temperature of the light-forming part is detected with a thermistor. The temperature of the light-forming part detected with a thermistor is a temperature set so that the temperature of each of the red laser diode, the green laser diode, and the blue laser diode reaches the temperature to be detected. In other words, the TEC is operated so that the temperature of each of the red laser diode, the green laser diode, and the blue laser diode reaches a temperature detected with the thermistor, and the power consumed by the TEC at this time is plotted in FIG. 8. In FIG. 8, the vertical axis shows the power consumption (W) of a TEC and the horizontal axis shows the environmental temperature (° C.). The environmental temperature is a temperature in an environment in which the light-forming part is disposed and is output as the temperature information of the environmental temperature. A line 14A indicates the case where the temperature of the light-forming part is 10° C., a line 14B indicates the case where the temperature of the light-forming part is 35° C., a line 14C indicates the case where the temperature of the light-forming part is 50° C., and a line 14D indicates the case where the temperature of the light-forming part is 60° C.

Referring to FIG. 8, when the difference between the temperature of the light-forming part and the environmental temperature is large, the TEC is operated so that the difference in temperature is decreased, which increases the power consumption of the TEC. This increases the amount of heat generated from the TEC. If the amount of heat generated from the TEC increases, the fan 104 sometimes needs to be frequently operated, which further increases the power consumption. Furthermore, the size of the heat sink 102 needs to be increased in some cases, which makes it difficult to achieve downsizing. Therefore, the power consumption of the TEC needs to be decreased to decrease the amount of heat generated from the TEC while a required optical output is ensured.

Figure 9:
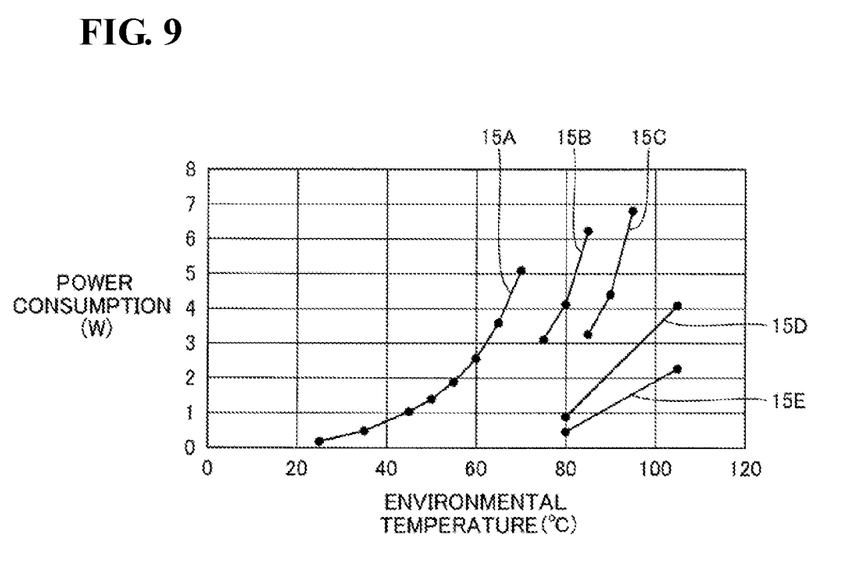
FIG. 9 is a graph illustrating the relationship between the environmental temperature and the power consumption of an electronic cooling module in terms of different temperatures of a light-forming part.

FIG. 9 is a graph illustrating, as in FIG. 8, the relationship between the environmental temperature and the power consumption of a TEC in terms of different temperatures of a light-forming part. In FIG. 9, the vertical axis shows the power consumption (W) of a TEC and the horizontal axis shows the environmental temperature (° C.). A line 15A indicates the case where the temperature of the light-forming part is 35° C. in an optical module in which the TEC is disposed in the substantially entire region of a single base plate, a line 15B indicates the case where the temperature of the light-forming part is 50° C. in an optical module in which the TEC is disposed in the substantially entire region of a single base plate, and a line 15C indicates the case where the temperature of the light-forming part is 60° C. in an optical module in which the TEC is disposed in the substantially entire region of a single base plate. A line 15D indicates the case where the temperature of the light-forming part 20 is 50° C. in the optical module 1 illustrated in FIG. 1 to FIG. 3 and a line 15E indicates the case where the temperature of the light-forming part 20 is 60° C. in the optical module 1 illustrated in FIG. 1 to FIG. 3. The line 15A corresponds to a part of the line 14B in FIG. 8, the line 15B corresponds to the line 14C in FIG. 8, and the line 15C corresponds to the line 14D in FIG. 8. The driving conditions of the optical module 1 are the same as those of known optical modules.

Referring to FIG. 9, for example, the comparison between the line 15B and the line 15D shows the following. At an environmental temperature of 80° C., the power consumption of the TEC slightly exceeds 4 W in the optical module in which the TEC is disposed in the substantially entire region of a single base plate. In contrast, the power consumption of the first TEC 30 falls below 1 W in the optical module 1 according to the present disclosure. The comparison between the line 15C and the line 15E also shows that the power consumption of the TEC is larger in the optical module in which the TEC is disposed in the substantially entire region of a single base plate than in the optical module 1 according to the present disclosure. In the optical module in which the TEC is disposed in the substantially entire region of a single base plate, the power consumption of the TEC exceeds 7 W at an environmental temperature of about 95° C. A further increase in the power consumption of the TEC may exceed the capacity of the heat sink. That is, the upper limit of the operating temperature range in the optical module in which the TEC is disposed in the substantially entire region of a single base plate is about 95° C. and does not reach 105° C. On the other hand, in the optical module 1 according to the present disclosure, even when the environmental temperature is about 105° C., the power consumption of the first TEC 30 merely exceeds 2 W. Even in the case indicated by the line 15D where the setting temperature is 50° C., the power consumption of the first TEC 30 merely exceeds 4 W and does not reach 5 W. That is, the power consumption of the first TEC 30 can be decreased in the optical module 1 according to the present disclosure compared with in the optical module in which the TEC is disposed in the substantially entire region of a single base plate.

Figure 10:
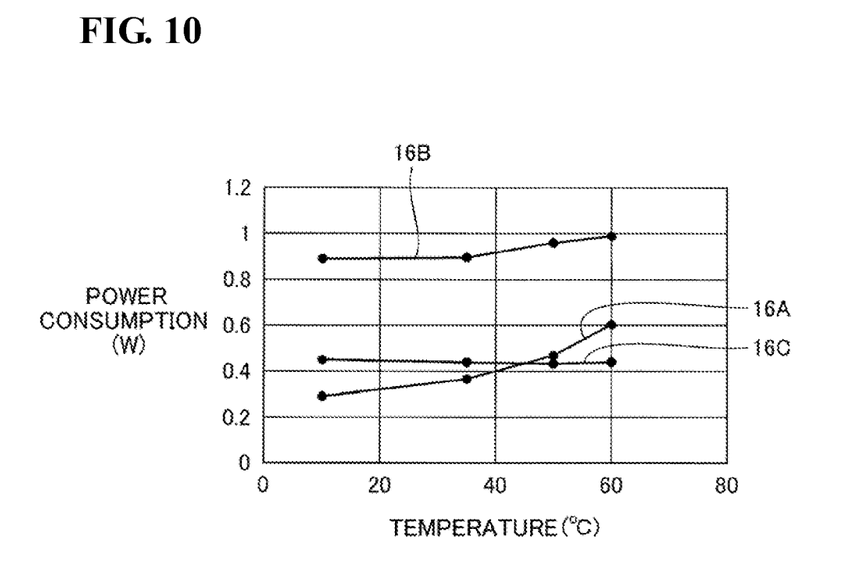
FIG. 10 is a graph illustrating the relationship between the temperatures of the red laser diode, the green laser diode, and the blue laser diode and the power consumption.

Herein, attention is paid to the relationship between the setting temperature at which the red laser diode 81, the green laser diode 82, and the blue laser diode 83 are operated and the power consumption. FIG. 10 is a graph illustrating the relationship between the setting temperature at which the red laser diode 81, the green laser diode 82, and the blue laser diode 83 are operated and the power consumption. The vertical axis shows the power consumption (W) of each laser diode and the horizontal axis shows the temperature (° C.) detected with the thermistor 43. The temperature detected with the thermistor 43 is a setting temperature of the light-forming part 20 at which the red laser diode 81, the green laser diode 82, and the blue laser diode 83 are operated. FIG. 10 illustrates the measured power consumption of the laser diode of each color at setting temperatures of 10° C., 35° C., 50° C., and 60° C. in FIG. 8.

Referring to FIG. 10, in the case of the red laser diode 81 indicated by the line 16A, the power consumption of the red laser diode 81 increases as the temperature of the light-forming part 20 increases. In the case of the green laser diode 82 indicated by the line 16B, the power consumption of the green laser diode 82 slightly increases as the setting temperature of the light-forming part 20 increases. However, the degree of the increase is lower than that in the case of the red laser diode 81. In the case of the blue laser diode 83 indicated by the line 16C, even if the setting temperature of the light-forming part 20 increases, the power consumption of the blue laser diode 83 is substantially constant. In other words, when the temperature of the light-forming part 20 increases, the power consumption of the laser diode tends to increase on the whole. The power consumption of the green laser diode 82 is largest, and the power consumptions of the red laser diode 81 and the blue laser diode 83 are substantially the same.

Figure 11:
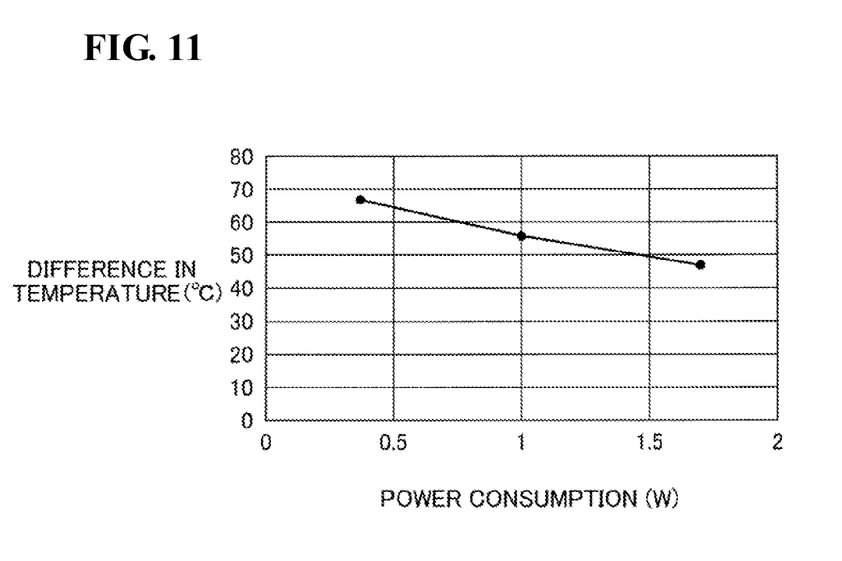
FIG. 11 is a graph illustrating the relationship between the maximum difference between the environmental temperature and the temperature of a light-forming part and the power consumption of the laser diode at a temperature of 35° C.

FIG. 11 is a graph illustrating the relationship between the maximum difference between the environmental temperature and the temperature of the light-forming part and the power consumption of the laser diode at a temperature of 35° C. The vertical axis shows the maximum difference (° C.) between the environmental temperature and the temperature of the light-forming part, and the horizontal axis shows the power consumption (W) at a temperature of 35° C. In the line of the graph in FIG. 11, the left end indicates the case of the optical module 1 according to this embodiment and the right end indicates the case of the optical module in which the TEC is disposed in the substantially entire region of a single base plate. Referring to FIG. 11, in the case of the optical module in which the TEC is disposed in the substantially entire region of a single base plate, the maximum difference in temperature is about 48° C. On the other hand, in the case of the optical module 1 according to this embodiment, the maximum difference in temperature is considerably increased to about 65° C. That is, the optical module 1 can be used in a wide temperature range. Herein, when the difference in temperature is about 65° C., the power consumption of the red laser diode 81 is about 0.4 W. The sum of the power consumptions of the green laser diode 82 and the blue laser diode 83 is about 1.3 W. The sum of the power consumptions of all laser diodes is about 1.7 W, and the power consumption seems to increase from the viewpoint of only the power consumption of the laser diodes. However, the power consumption of the first TEC 30 decreases. The total power consumption of the red laser diode 81, the green laser diode 82, and the blue laser diode 83 is larger in the optical module 1 according to this embodiment than in the optical module in which the TEC is disposed in the substantially entire region of a single base plate. However, the increment in the power consumption is smaller than the decrease in the power consumption of the first TEC 30 in the optical module 1 according to this embodiment that employs the first TEC 30.

Thus, in the optical module 1 according to this embodiment in which the TEC is disposed on only the first base plate 60 side, the power consumption can be decreased while the system size is decreased.

Second Embodiment

Next, a second embodiment that is another embodiment of the optical module according to the present disclosure will be described.

Figure 12:
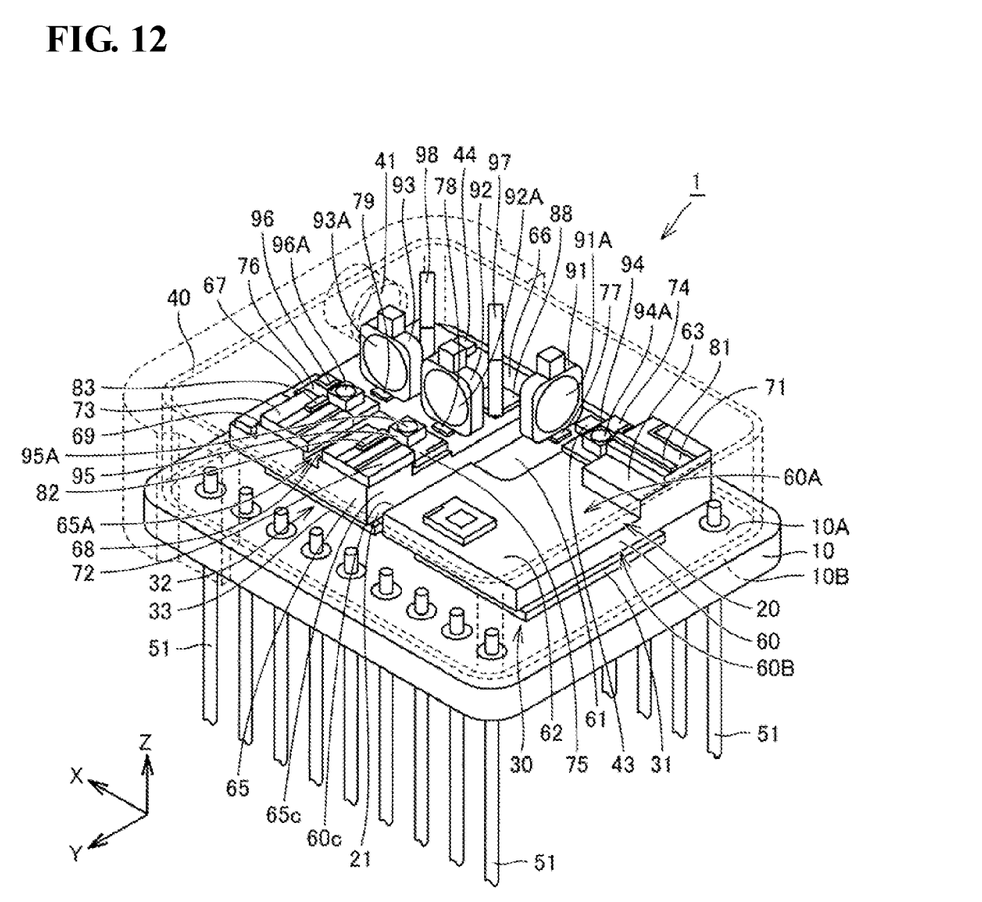
FIG. 12 is a schematic perspective view illustrating a structure of an optical module according to a second embodiment.

Referring to FIG. 12 and FIG. 2, an optical module 1 according to this embodiment basically has the same structure and produces the same effects as in the first embodiment, except that the optical module 1 according to the second embodiment further includes a second electronic cooling module (second TEC) 32 and a thermistor 44.

Specifically, referring to FIG. 12, the optical module 1 according to the second embodiment further includes a second TEC 32 between the base 10 and the second base plate 65. The optical module 1 further includes a thermistor 44. In this case, the thickness of the second base plate 65 is smaller than that in the first embodiment by the thickness of the second TEC 32. The thermistor 44 used for adjusting the temperature of the second base plate 65 is disposed in the second base region 66. The second TEC 32 has the same structure as the first TEC 30 and includes a heat-absorbing plate (not illustrated), a heat-dissipating plate 33, and semiconductor pillars (not illustrated) arranged between the heat-absorbing plate and the heat-dissipating plate 33 with electrodes disposed therebetween. The heat-absorbing plate and the heat-dissipating plate 33 are formed of, for example, alumina. The heat-absorbing plate is disposed in contact with the other main surface 65B of the second base plate 65. The heat-dissipating plate 33 is disposed in contact with the one main surface 10A of the base 10. In this embodiment, the second TEC 32 is a Peltier module (Peltier device). By passing an electric current through the second TEC 32, heat of the second base plate 65 in contact with the heat-absorbing plate moves to the base 10, which cools the second base plate 65. By disposing the second TEC 32, the temperatures of the green laser diode 82 and the blue laser diode 83 disposed on the second base plate 65 can be adjusted. This can suppress increases in the temperatures of the green laser diode 82 and the blue laser diode 83 to the environmental temperature. Thus, the temperatures of the green laser diode 82 and the blue laser diode 83 can be adjusted. As a result, the temperature of the red laser diode 81 and the temperatures of the green laser diode 82 and the blue laser diode 83 can be separately adjusted. Therefore, a large temperature change can be handled.

In the above embodiment, the second laser is a green laser, but may be a blue laser. That is, the second laser may be a laser configured to emit green light or a laser configured to emit blue light. Furthermore, in the above embodiment, the optical module 1 includes the red laser diode 81 serving as a first laser, the green laser diode 82 serving as a second laser, and the blue laser diode 83 serving as a third laser, but is not limited thereto. The optical module 1 may be an optical module that includes the red laser diode 81 serving as a first laser and either of the green laser diode 82 or the blue laser diode 83 serving as a second laser and that emits light through multiplexing of two colors of light.

In the above embodiment, the optical axis heights of the first laser and the second laser from the reference surface match each other, but are not limited thereto. The optical axis heights of the first laser and the second laser from the reference surface may match each other after emission from the optical module 1.

In the above embodiment, the first base plate 60 and the second base plate 65 are disposed spatially away from each other, but are not limited thereto. The first base plate 60 and the second base plate 65 may be thermally separated from each other (thermal conduction is suppressed) by interposing, between the first base plate 60 and the second base plate 65, a member that thermally separates the first base plate 60 and the second base plate 65 (a member that suppresses the thermal conduction). In the above embodiment, a gas whose moisture content is reduced (whose moisture is removed), such as dry air, is present between the first base plate 60 and the second base plate 65. In consideration of low thermal conductivity, dry air is preferred.

The embodiments disclosed herein are mere examples in all respects and should be understood as being non-limitative in any perspective. The scope of the present invention is defined not by the above description but by claims. The scope of the present invention is intended to embrace all the modifications within the meaning and range of equivalency of the claims.

REFERENCE SIGNS LIST 1 optical module
10 base
10A one main surface
10B the other main surface
11A, 11B, 11C, 11D, 11E, 11F, 11G, 11H, 11J, 11K, 12A, 12B, 12C, 12D, 12E, 12F, 12G, 12H, 12J, 12K, 13A, 13B, 14A, 14B, 14C, 14D, 15A, 15B, 15C, 15D, 15E, 16A, 16B, 16C line
20 light-forming part
21 gap
30 first electronic cooling module (first TEC)
31, 33 heat-dissipating plate
32 second electronic cooling module (second TEC)
40 cap 41 emission window
43, 44 thermistor
51 lead pin
60 first base plate
60A one main surface
60B the other main surface
60C side surface
61 first base region
62 first chip mounted region
63 first laser mounted region
65 second base plate
65A one main surface
65B the other main surface
65C side surface
66 second base region
67 second chip mounted region
68 second laser mounted region
69 third laser mounted region
71 first submount
72 second submount
73 third submount
74 fourth submount
75 fifth submount
76 sixth submount
77 first lens support member
78 second lens support member
79 third lens support member
81 red laser diode
82 green laser diode
83 blue laser diode
88 first protruding region
89 second protruding region
91 first lens
92 second lens
93 third lens
91A, 92A, 93A lens unit
94 first photodiode
95 second photodiode
96 third photodiode
94A, 95A, 96A light-receiving unit
97 first filter
98 second filter
101 heat dissipation system
102 heat sink
103 presser plate
103A first guide portion
103B second guide portion
103C third guide portion
104 fan
105 connector
106 base member
106A one main surface
106B the other main surface
107 fin
108A, 108B, 108C, 108D tapped hole
109A, 109B, 109C, 109D screw

The invention claimed is:

1. An optical module comprising:
a first base member;
a first submount disposed on the first base member;
a second base member disposed spatially away from the first base member, wherein the second base member is not in direct contact with the first base member;
a first laser disposed on the first submount and configured to emit red light;
a second laser disposed on the second base member and configured to emit light with a color other than red;
a first electronic cooling module disposed in contact with the first base member and configured to adjust a temperature of the first laser; and
a base supporting the first base member with the first electronic cooling module disposed between the base and the first base member, wherein
the first base member comprises a first region, a second region, and a third region;
the optical module further comprises a first lens disposed on the first base member in the first region;
the first submount is disposed on the first base member in the third region;
a thickness of the first base member in the second region is greater than a thickness of the first base member in the first region; and
a thickness of the of the first base member in the third region is greater than the thickness of the first base member in the second region.

2. The optical module according to claim 1, wherein the second laser is configured to emit green light or blue light.

3. The optical module according to claim 1, further comprising a second electronic cooling module disposed in contact with the second base member and configured to adjust a temperature of the second laser.

4. The optical module according to claim 3, further comprising a protective member that surrounds the first base member, the second base member, the first laser, the second laser, the first electronic cooling module, and the second electronic cooling module.

5. The optical module according to claim 1, wherein optical axis heights of the first laser and the second laser from a reference surface match each other.

6. The optical module according to claim 1, further comprising:
a second submount disposed directly on the second base member, wherein
the first submount is disposed directly on the first base member; and
the second laser is disposed on the second submount.

* * * * *